United States Patent
Choi

(10) Patent No.: US 9,450,107 B1
(45) Date of Patent: Sep. 20, 2016

(54) EPROM CELLS, EPROM CELL ARRAYS INCLUDING THE SAME, AND METHODS OF FABRICATING THE SAME

(71) Applicant: SK hynix Inc., Gyeonggi-do (KR)

(72) Inventor: Kwang Il Choi, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/885,696

(22) Filed: Oct. 16, 2015

(30) Foreign Application Priority Data

Sep. 9, 2015 (KR) .................. 10-2015-0127675

(51) Int. Cl.

| H01L 29/788 | (2006.01) |
|---|---|
| H01L 29/78 | (2006.01) |
| H01L 29/10 | (2006.01) |
| H01L 27/115 | (2006.01) |
| H01L 23/528 | (2006.01) |
| H01L 29/47 | (2006.01) |

(52) U.S. Cl.
CPC ......... *H01L 29/7886* (2013.01); *H01L 23/528* (2013.01); *H01L 27/11521* (2013.01); *H01L 29/1095* (2013.01); *H01L 29/782* (2013.01); *H01L 29/7839* (2013.01); *H01L 29/47* (2013.01); *H01L 29/7835* (2013.01); *H01L 29/7841* (2013.01)

(58) Field of Classification Search
CPC . H01L 29/47; H01L 29/782; H01L 29/7839; H01L 29/7841; H01L 29/7835
USPC ................................. 257/316, 476
See application file for complete search history.

(56) References Cited

U.S. PATENT DOCUMENTS

| 4,801,983 | A | * | 1/1989 | Ueno | H03K 17/687 257/390 |
|---|---|---|---|---|---|
| 5,132,748 | A | * | 7/1992 | Yano | H01L 27/108 257/256 |
| 5,563,081 | A | * | 10/1996 | Ozawa | H01L 27/11502 148/DIG. 139 |
| 6,660,585 | B1 | * | 12/2003 | Lee | H01L 29/66825 257/E21.209 |
| 2004/0029322 | A1 | * | 2/2004 | Prall | H01L 21/28273 438/142 |
| 2008/0093646 | A1 | * | 4/2008 | Lee | H01L 29/7881 257/314 |
| 2008/0099808 | A1 | * | 5/2008 | Burnett | G11C 11/404 257/295 |
| 2009/0065814 | A1 | * | 3/2009 | Bhalla | H01L 29/66143 257/230 |
| 2010/0187595 | A1 | * | 7/2010 | Lee | H01L 21/28273 257/321 |
| 2011/0070710 | A1 | * | 3/2011 | Lee | H01L 21/26586 438/302 |
| 2012/0267698 | A1 | * | 10/2012 | Wu | H01L 27/11521 257/316 |

(Continued)

FOREIGN PATENT DOCUMENTS

KR 1020110075897 7/2011

*Primary Examiner* — George Fourson, III
(74) *Attorney, Agent, or Firm* — IP & T Group LLP

(57) ABSTRACT

An electrically programmable read only memory (EPROM) cell includes a semiconductor layer having a first conductivity, a first junction region having a second conductivity and a second junction region having the second conductivity, wherein the first and the second junction regions are disposed in an upper region of the semiconductor layer and spaced apart from each other, a gate insulation pattern and a floating gate pattern sequentially stacked over the semiconductor layer between the first and second junction regions, a first metal contact plug coupled to the first junction region, wherein an ohmic contact is formed between the first metal contact plug and the first junction region, and a second metal contact plug coupled to the second junction region, wherein a schottky contact is formed between the second metal contact plug and the second junction region.

21 Claims, 15 Drawing Sheets

(56) References Cited

U.S. PATENT DOCUMENTS

2013/0176769 A1* 7/2013 Chang .................. G11C 11/417
                                                     365/154

2014/0239346 A1* 8/2014 Green .................. H01L 27/0629
                                                     257/192
2014/0268444 A1* 9/2014 Bertin .................. H01L 27/0266
                                                     361/56

* cited by examiner

EPROM CELLS, EPROM CELL ARRAYS INCLUDING THE SAME, AND METHODS OF FABRICATING THE SAME

CROSS-REFERENCE TO RELATED APPLICATIONS

The present application claims priority under 35 U.S.C 119(a) to Korean Patent Application No. 10-2015-0127675, filed on Sep. 9, 2015, which is herein incorporated by reference in its entirety as set forth in full.

BACKGROUND

1. Technical Field

Various embodiments of the present disclosure relate to nonvolatile memory devices and methods of fabricating the same and, more particularly, to electrically programmable read only memory (EPROM) cells, EPROM cell arrays including the same, and methods of fabricating the same.

2. Related Art

EPROM devices may correspond to ROM devices that are electrically programmable. The EPROM devices belong to nonvolatile memory devices that retain their stored data even when their power supplies are interrupted. A unit cell of the EPROM devices may include a field effect transistor (FET) having a source region, a drain region, and a conductive channel region between the source region and the drain region. The FET used as the unit cell of the EPROM devices may have a floating gate disposed on the channel region. The floating gate of the EPROM cell may be electrically isolated. Electric charges may be injected into the floating gate of the EPROM cell to store information that is, a datum in the EPROM cell. Since the floating gate of the EPROM cell is electrically isolated, the electric charges injected into the floating gate of the EPROM cell may still remain even when a power supply of the EPROM device is interrupted. The electric charges injected into the floating gate of the EPROM cell may affect a conductivity of the channel region of the FET used as the EPROM cell. Thus, the information stored in the EPROM cell may be read out by detecting a current that flows through the channel region between the source region and the drain region.

SUMMARY

Various embodiments are directed to EPROM cells, EPROM cell arrays including the same, and methods of fabricating the same.

According to an embodiment, an EPROM cell includes a semiconductor layer having a first conductivity, a first junction region having a second conductivity and a second junction region having the second conductivity, wherein the first and the second junction regions are disposed in an upper region of the semiconductor layer and spaced apart from each other, a gate insulation pattern and a floating gate pattern sequentially stacked over the semiconductor layer between the first and second junction regions, a first metal contact plug coupled to the first junction region, wherein an ohmic contact is formed between the first metal contact plug and the first junction region, and a second metal contact plug coupled to the second junction region, wherein a schottky contact is formed between the second metal contact plug and the second junction region.

According to another embodiment, an EPROM cell array includes first selection lines, second selection lines intersecting the first selection lines, and unit cells respectively disposed at cross points of the first and second selection lines. Each of the unit cells comprises a semiconductor layer having a first conductivity, a first junction region having a second conductivity and a second junction region having the second conductivity, wherein the first and the second junction regions are disposed in an upper region of the semiconductor layer and spaced apart from each other, a gate insulation pattern and a floating gate pattern sequentially stacked over the semiconductor layer between the first and second junction regions, a first metal contact plug coupled to the first junction region, wherein an ohmic contact is formed between the first metal contact plug and the first junction region, and a second metal contact plug coupled to the second junction region, wherein a schottky contact is formed between the second metal contact plug and the second junction region.

According to another embodiment, an EPROM cell array includes a plurality of first selection lines, a plurality of second selection lines intersecting the plurality of first selection lines, and a plurality of unit cells respectively disposed at cross points of the plurality of first selection lines and the plurality of second selection lines, wherein each of the plurality of unit cells includes a MOSFET and a schottky barrier diode. The MOSFET and the schottky barrier diode are coupled in series to each other between any one of the plurality of first selection lines and any one of the plurality of second selection lines.

According to another embodiment, a method of fabricating an EPROM cell includes forming a gate insulation pattern over a semiconductor layer, wherein the semiconductor layer has a first conductivity, forming a floating gate pattern over the gate insulation pattern; implanting impurity ions having a second conductivity into the semiconductor layer using the floating gate pattern as an ion implantation mask to form a first junction region and a second junction region, wherein both of the first and the second junction regions have a first impurity concentration, forming a first gate spacer over a first sidewall of the floating gate pattern and over a first sidewall of the gate insulation pattern, forming a second gate spacer over a second sidewall of the floating gate pattern and over a second sidewall of the gate insulation pattern, forming a mask pattern that exposes the first junction region and covers the second junction region, implanting impurity ions having the second conductivity into the first junction region using the mask pattern and the first gate spacer as an ion implantation mask to form a first heavily doped junction region in an upper region of the first junction region, wherein the first heavily doped junction region has a second impurity concentration, removing the mask pattern, and forming a first metal contact plug and a second metal contact plug coupled to the first heavily doped junction region and the second junction region, respectively. The first heavily doped junction region and the first metal contact plug are in contact with each other to provide an ohmic contact, and the second junction region and the second metal contact plug are in contact with each other to provide a schottky contact.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over," "above," "under," "beneath," "below," "side," "aside," and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
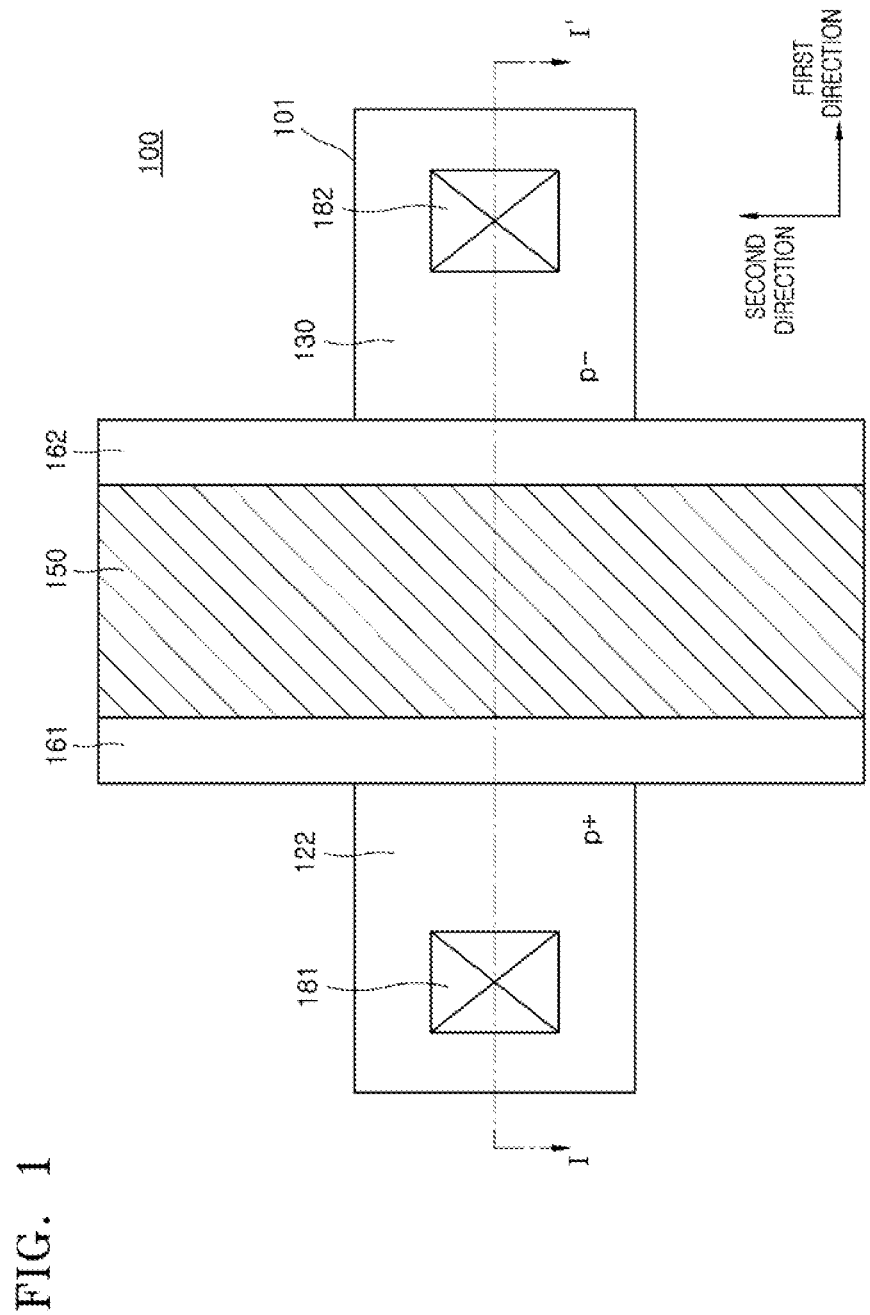
FIG. 1 is a layout diagram illustrating an EPROM cell according to an embodiment.
Figure 2:
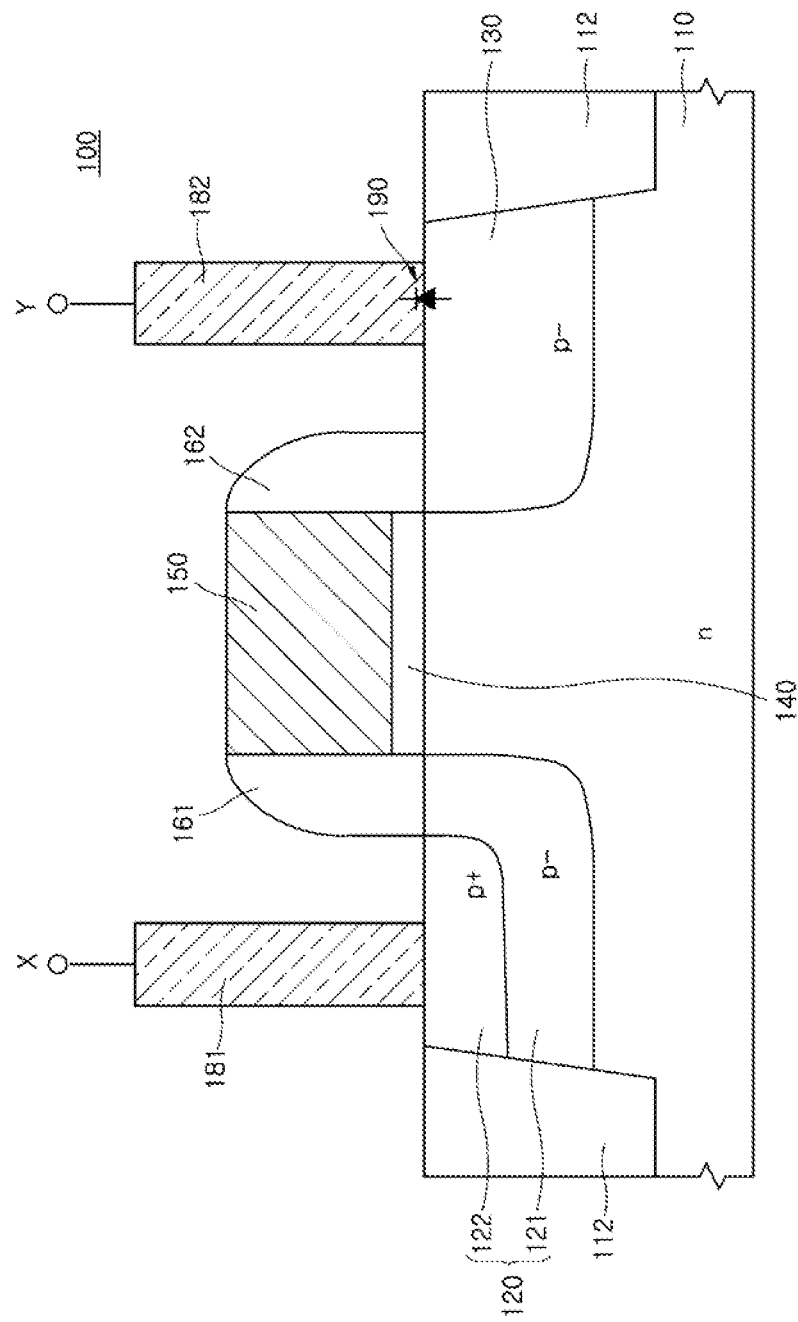
FIG. 2 is a cross-sectional view taken along the line I-I' of FIG. 1.

FIG. 1 is a layout diagram illustrating an EPROM cell 100 according to an embodiment, and FIG. 2 is a cross-sectional view taken along a line I-I' of FIG. 1. Referring to FIGS. 1 and 2, the EPROM cell 100 may include an N-type semiconductor layer 110 having an active region 101. The active region 101 may extend in a first direction to have a stripe shape. The active region 101 may be defined by a trench isolation layer 112 disposed in the N-type semiconductor layer 110. The N-type semiconductor layer 110 may be a substrate comprised of a semiconductor material such as a silicon material. In some embodiments, the N-type semiconductor layer 110 may be a well region disposed in a substrate.

A first P-type junction region 121 and a second P-type junction region 130 may be disposed in an upper region of the active region 101 defined in the N-type semiconductor layer 110 to be spaced apart from each other. The second P-type junction region 130 may have a first impurity concentration. The first impurity concentration may be controlled to be lower than a predetermined concentration such that the second P-type junction region 130 and a metal plug or a metal silicide layer contacting the second P-type junction region 130 exhibit a rectifying characteristic such as a P-N diode characteristic. In some embodiments, the first and second P-type junction regions 121 and 130 may be simultaneously formed using the same ion implantation process and the same activation process. In such a case, the first and second P-type junction regions 121 and 130 may have substantially the same impurity concentration and substantially the same junction depth.

A first heavily doped P-type junction region 122 may be disposed in an upper region of the first P-type junction region 121. The first P-type junction region 121 and the first heavily doped P-type junction region 122 may constitute a first junction region 120 having a double diffused drain (DDD) structure. The first heavily doped P-type junction region 122 may have a second impurity concentration which is higher than the first impurity concentration. The second impurity concentration may be controlled to be sufficiently higher than a certain concentration such that the first heavily doped P-type junction region 122 and a metal plug or a metal silicide layer contacting the first heavily doped P-type junction region 122 exhibit an ohmic contact characteristic.

A gate insulation pattern 140 may be disposed on the N-type semiconductor layer 110 between the first and second P-type junction regions 121 and 130. A floating gate pattern 150 may be disposed on a top surface of the gate insulation pattern 140 opposite to the N-type semiconductor layer 110. In some embodiments, the gate insulation pattern 140 may include an oxide layer, and the floating gate pattern 150 may include a polysilicon layer. The floating gate pattern 150 may be fully surrounded by an insulation layer. Thus, the floating gate pattern 150 may be electrically isolated and floated. The gate insulation pattern 140 and the floating gate pattern 150 may fully overlap with each other in a plan view such that sidewalls of the gate insulation pattern 140 are vertically self-aligned with sidewalls of the floating gate pattern 150 respectively. The floating gate pattern 150 may extend in a second direction intersecting the first direction to have a stripe shape.

A first gate spacer 161 and a second gate spacer 162 may be disposed on both sidewalls of the floating gate pattern 150, respectively. The first gate spacer 161 and the second gate spacer 162 may downwardly extend to cover both sidewalls of the gate insulation pattern 140, respectively. In some embodiments, each of the first and second gate spacers 161 and 162 may include a nitride layer, an oxide layer, or a combination thereof. The first and second P-type junction regions 121 and 130 may be aligned with both sidewalls of the gate insulation pattern 140, respectively. The first heavily doped P-type junction region 122 may be aligned with an outer sidewall of the first gate spacer 161.

A first metal contact plug 181 may be disposed on a top surface of the first heavily doped P-type junction region 122. The first heavily doped P-type junction region 122 and the first metal contact plug 181 may contact each other to provide an ohmic contact. In some embodiments, the first metal contact plug 181 may be a tungsten plug. The first metal contact plug 181 may be electrically coupled to a first selection line X.

A second metal contact plug 182 may be disposed on a top surface of the second P-type junction region 130. In some embodiments, the second metal contact plug 182 may be a tungsten plug. The second metal contact plug 182 may be electrically coupled to a second selection line Y.

The second P-type junction region 130 and the second metal contact plug 182 may contact each other to provide a schottky contact. That is, the second P-type junction region 130 and the second metal contact plug 182 may constitute a schottky barrier diode 190. The second P-type junction region 130 and the second metal contact plug 182 may correspond to an anode and a cathode of the schottky barrier diode 190, respectively. Thus, a current may flow from the second P-type junction region 130 toward the second metal contact plug 182 when the schottky barrier diode 190 is forward-biased. If the schottky barrier diode 190 is reverse-biased, no current flows through the schottky barrier diode 190. If the EPROM cell 100 is repeatedly arrayed in a matrix form to provide an EPROM cell array, malfunction of the EPROM cell array due to a sneak current may be suppressed due to the presence of the schottky barrier diodes 190 exhibiting a rectifying characteristic.

A program operation of the EPROM cell 100 having the aforementioned configuration may depend on transfer of electric charges injected into the floating gate pattern 150 by an avalanche injection of electrons. If a bias condition applied to the first junction region 120 or the second P-type junction region 130 meets the avalanche injection condition, electric charges may be injected into the floating gate pattern 150.

For example, if a positive program voltage is applied to the first junction region 120 while the second P-type junction region 130 is grounded, the positive program voltage applied to the first junction region 120 may be transmitted to the N-type semiconductor layer 110. Thus, a reverse bias may be applied between the N-type semiconductor layer 110 and the second P-type junction region 130.

If the positive program voltage has a sufficient high level, a strong electric field may be created between the N-type semiconductor layer 110 and the second P-type junction region 130 to cause an avalanche breakdown phenomenon at a junction region between the N-type semiconductor layer 110 and the second P-type junction region 130. As a result, hot electrons generated in a depletion region between the N-type semiconductor layer 110 and the second P-type junction region 130 may be injected into the floating gate pattern 150 through the gate insulation pattern 140 by the strong electric field. If the hot electrons are injected into the floating gate pattern 150, a threshold voltage of the EPROM cell 100 may be lowered and the EPROM cell 100 may have a programmed state.

A read operation of the EPROM cell 100 may be achieved by applying a positive read voltage to the first junction region 120 and by applying a ground voltage to the second P-type junction region 130. The positive read voltage may have a voltage level between a threshold voltage of the EPROM cell having a programmed state and a threshold voltage of the EPROM cell having a non-programmed state. Thus, under the above read bias condition, a current may flow from the first junction region 120 toward the second P-type junction region 130 or no current may flow from the first junction region 120 toward the second P-type junction region 130.

That is, if the EPROM cell 100 is programmed to have a relatively low threshold voltage, a current may flow from the first junction region 120 toward the second P-type junction region 130 under the above read bias condition. In contrast, if the EPROM cell 100 is not programmed to have a relatively high threshold voltage, no current may flow from the first junction region 120 toward the second P-type junction region 130 under the above read bias condition or only a leakage current may flow from the first junction region 120 toward the second P-type junction region 130 under the above read bias condition. Accordingly, information stored in the EPROM cell 100 may be read out by sensing a current that flows through the EPROM cells.

Figure 3:
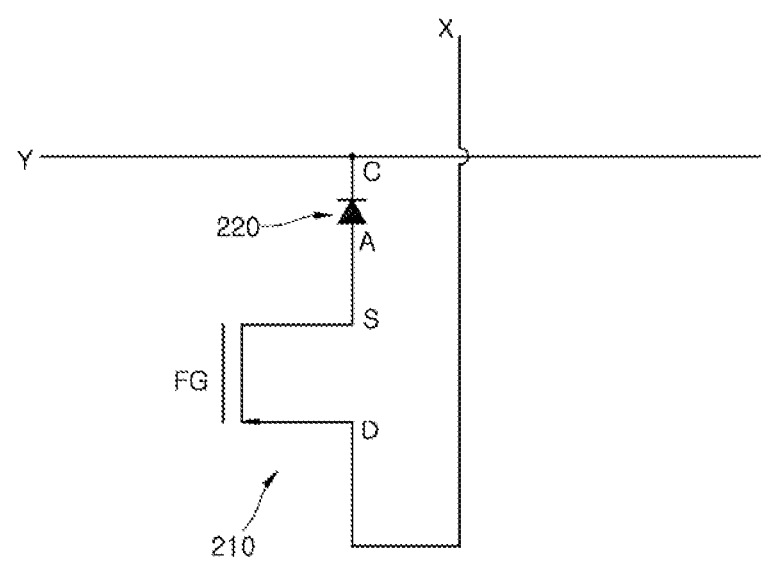
FIG. 3 illustrates an equivalent circuit diagram of the EPROM cell shown in FIG. 1.

FIG. 3 is an equivalent circuit diagram of the EPROM cell 100 shown in FIG. 1. Referring to FIG. 3, the EPROM cell 100 may be configured to include a metal-oxide-semiconductor field effect transistor (MOSFET) 210 and a schottky barrier diode 220. The MOSFET 210 may include a floating gate FG, a drain terminal D and a source terminal S.

The floating gate FG of the MOSFET 210 may correspond to the floating gate pattern 150 of the EPROM cell 100 shown in FIGS. 1 and 2. The drain terminal D and the source terminal S of the MOSFET 210 may correspond to the first junction region 120 and the second P-type junction region 130 of the EPROM cell 100 shown in FIGS. 1 and 2, respectively. The drain terminal D of the MOSFET 210 may be electrically coupled to the first selection line X. The schottky barrier diode 220 may correspond to the schottky barrier diode 190 comprised of the second P-type junction region 130 and the second metal contact plug 182 shown in FIGS. 1 and 2. The schottky barrier diode 220 may be coupled between the source terminal S of the MOSFET 210 and the second selection line Y. An anode A and a cathode C of the schottky barrier diode 220 may be electrically coupled to the source terminal S of the MOSFET 210 and the second selection line Y, respectively.

Figure 4:
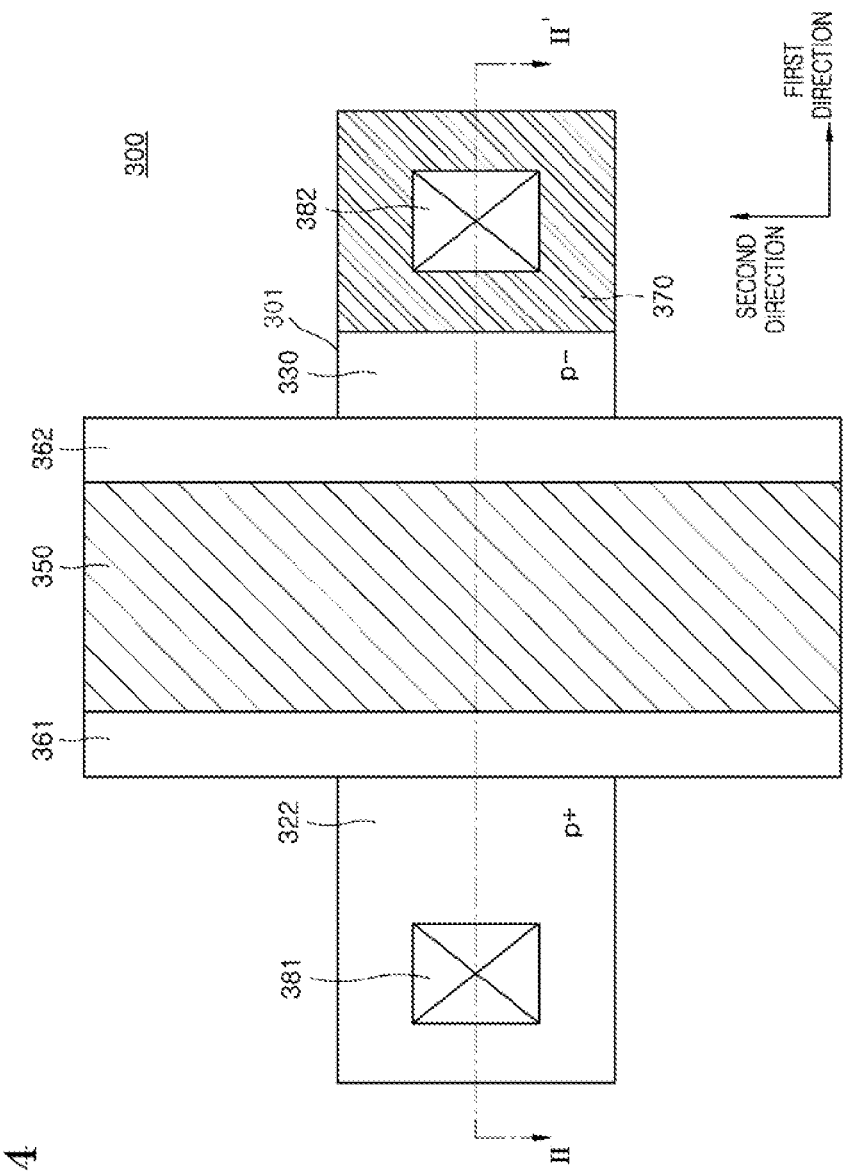
FIG. 4 is a layout diagram illustrating an EPROM cell according to another embodiment.
Figure 5:
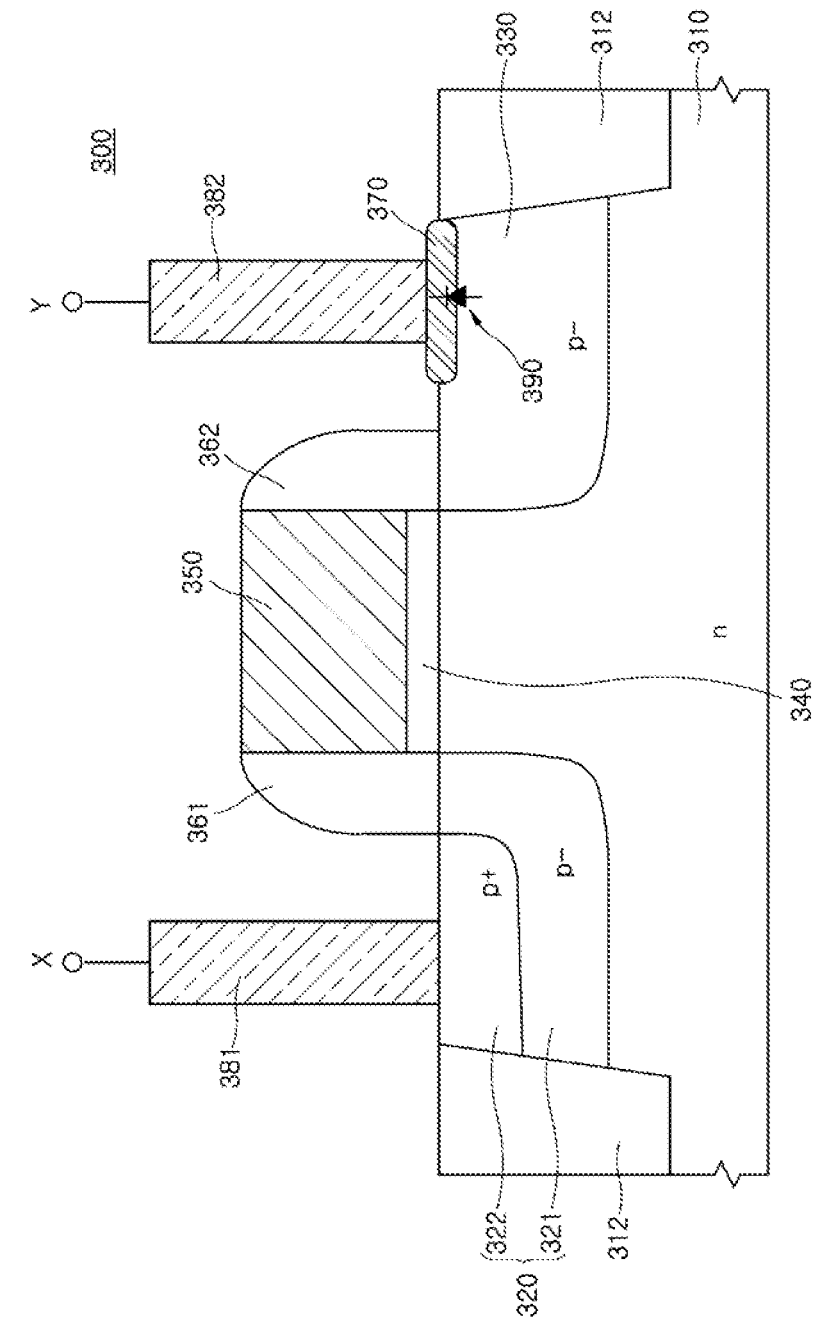
FIG. 5 is a cross-sectional view taken along the line II-II' of FIG. 4.

FIG. 4 is a layout diagram illustrating an EPROM cell 300 according to another embodiment, and FIG. 5 is a cross-sectional view taken along the line II-II' of FIG. 4. Referring to FIGS. 4 and 5, the EPROM cell 300 may include an N-type semiconductor layer 310 having an active region 301. The active region 301 may extend in a first direction to have a stripe shape. The active region 301 may be defined by a trench isolation layer 312 disposed in the N-type semiconductor layer 310. The N-type semiconductor layer 310 may be a substrate comprised of a semiconductor material such as a silicon material. In some embodiments, the N-type semiconductor layer 310 may be a well region disposed in a substrate.

A first P-type junction region 321 and a second P-type junction region 330 may be disposed in an upper region of the active region 301 defined in the N-type semiconductor layer 310 to be spaced apart from each other. The second P-type junction region 330 may have a first impurity concentration. The first impurity concentration may be controlled to be lower than a predetermined concentration such that the second P-type junction region 330 and a metal plug or a metal silicide layer contacting the second P-type junction region 330 exhibit a rectifying characteristic such as a P-N diode characteristic.

In some embodiments, the first and second P-type junction regions 321 and 330 may be simultaneously formed using the same ion implantation process and the same activation process. In such a case, the first and second P-type junction regions 321 and 330 may have substantially the same impurity concentration and substantially the same junction depth.

A first heavily doped P-type junction region 322 may be disposed in an upper region of the first P-type junction region 321. The first P-type junction region 321 and the first heavily doped P-type junction region 322 may constitute a first junction region 320 having a double diffused drain (DDD) structure. The first heavily doped P-type junction region 322 may have a second impurity concentration which is higher than the first impurity concentration. The second impurity concentration may be controlled to be sufficiently higher than a certain concentration such that the first heavily doped P-type junction region 322 and a metal plug or a metal silicide layer contacting the first heavily doped P-type junction region 322 exhibit an ohmic contact characteristic.

A gate insulation pattern 340 may be disposed on the N-type semiconductor layer 310 between the first and second P-type junction regions 321 and 330. A floating gate pattern 350 may be disposed on a top surface of the gate insulation pattern 340 opposite to the N-type semiconductor layer 310. In some embodiments, the gate insulation pattern 340 may include an oxide layer, and the floating gate pattern 350 may include a polysilicon layer. The floating gate pattern 350 may be fully surrounded by an insulation layer. Thus, the floating gate pattern 350 may be electrically isolated and floated.

The gate insulation pattern 340 and the floating gate pattern 350 may fully overlap with each other in a plan view such that sidewalls of the gate insulation pattern 340 are vertically self-aligned with sidewalls of the floating gate pattern 350 respectively. The floating gate pattern 350 may extend in a second direction intersecting the first direction to have a stripe shape.

A first gate spacer 361 and a second gate spacer 362 may be disposed on both sidewalls of the floating gate pattern 350, respectively. The first gate spacer 361 and the second gate spacer 362 may downwardly extend to cover both sidewalls of the gate insulation pattern 340, respectively. In some embodiments, each of the first and second gate spacers 361 and 362 may include a nitride layer, an oxide layer, or a combination thereof.

The first and second P-type junction regions 321 and 330 may be aligned with both sidewalls of the gate insulation pattern 340, respectively. The first heavily doped P-type junction region 322 may be aligned with an outer sidewall of the first gate spacer 361.

A first metal contact plug 381 may be disposed on a top surface of the first heavily doped P-type junction region 322. The first heavily doped P-type junction region 322 and the first metal contact plug 381 may contact each other to provide an ohmic contact. The first metal contact plug 381 may be electrically coupled to a first selection line X.

A metal silicide layer 370 may be disposed on the second P-type junction region 330. A second metal contact plug 382 may be disposed on the metal silicide layer 370. The second metal contact plug 382 may be electrically coupled to a second selection line Y.

The second P-type junction region 330 and the metal silicide layer 370 may contact each other to provide a schottky contact. That is, the second P-type junction region 330 and the metal silicide layer 370 may constitute a schottky barrier diode 390. The second P-type junction region 330 and the metal silicide layer 370 may correspond to an anode and a cathode of the schottky barrier diode 390, respectively.

Thus, a current may flow from the second P-type junction region 330 toward the metal silicide layer 370 when the schottky barrier diode 390 is forward-biased. If the schottky barrier diode 390 is reverse-biased, no current flows through the schottky barrier diode 390. If the EPROM cell 300 is repeatedly arrayed in a matrix form to provide an EPROM cell array, malfunction of the EPROM cell array due to a sneak current may be suppressed due to the presence of the schottky barrier diodes 390 exhibiting a rectifying characteristic.

Figure 6:
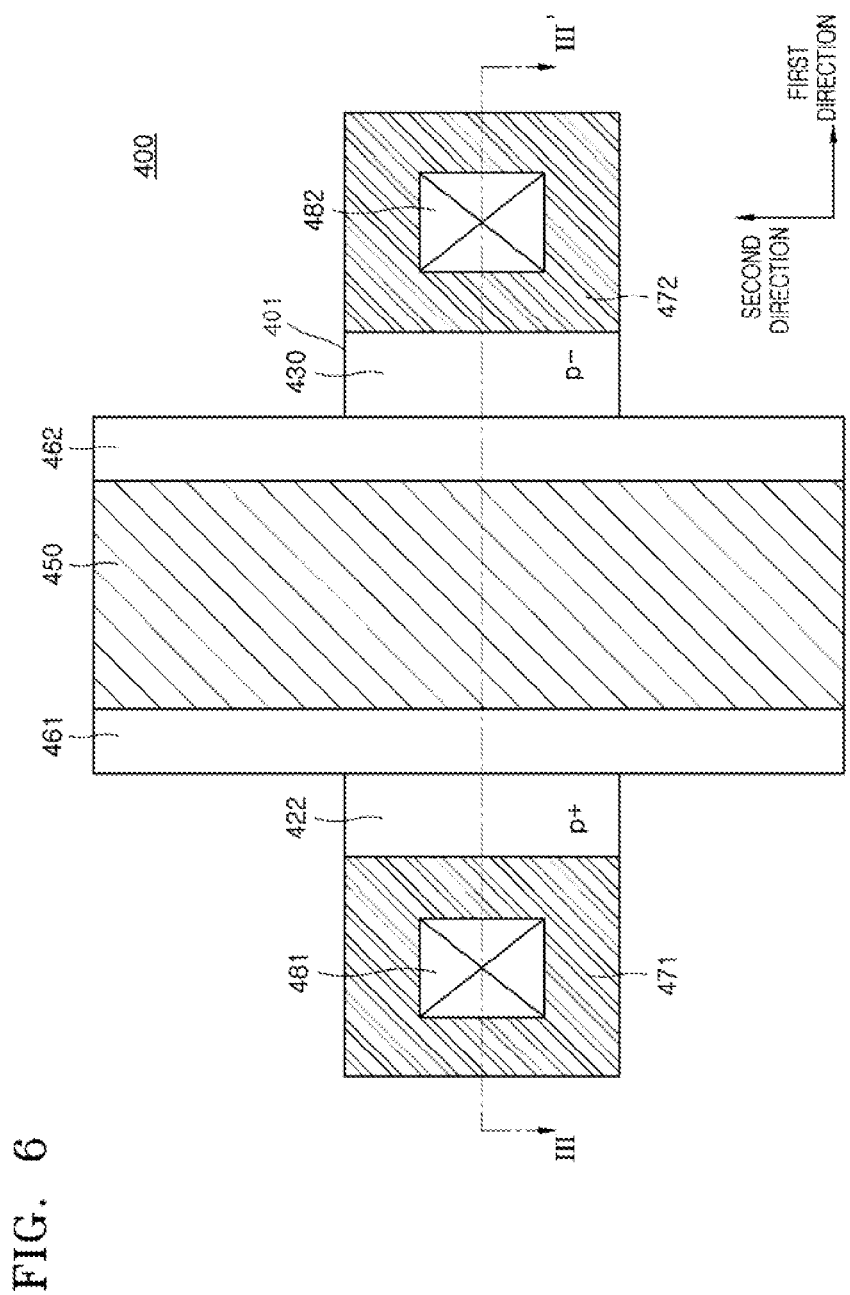
FIG. 6 is a layout diagram illustrating an EPROM cell according to yet another embodiment.
Figure 7:
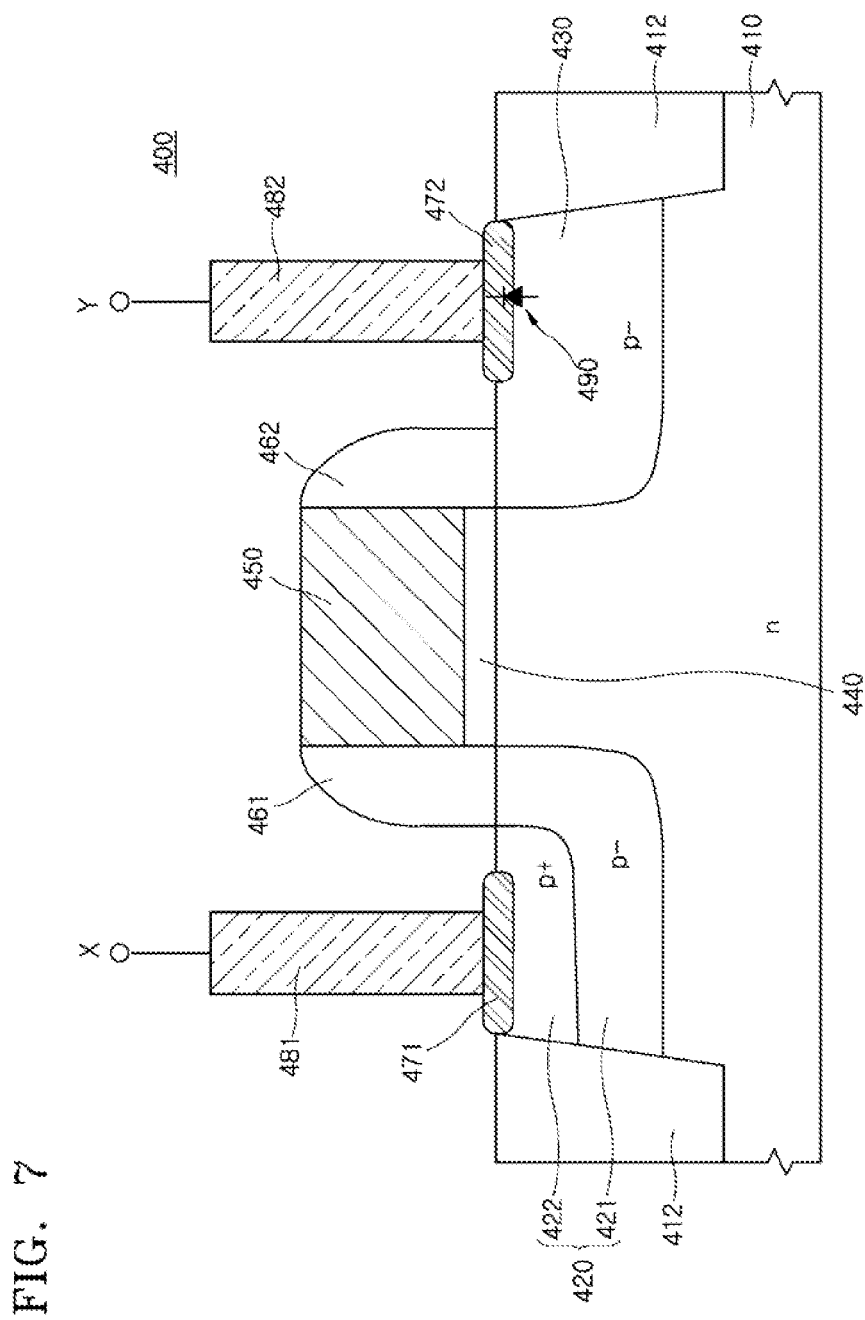
FIG. 7 is a cross-sectional view taken along a line III-III' of FIG. 6.

FIG. 6 is a layout diagram illustrating an EPROM cell 400 according to yet another embodiment, and FIG. 7 is a cross-sectional view taken along the line III-III' of FIG. 6. Referring to FIGS. 6 and 7, the EPROM cell 400 may include an N-type semiconductor layer 410 having an active region 401. The active region 401 may extend in a first direction to have a stripe shape. The active region 401 may be defined by a trench isolation layer 412 disposed in the N-type semiconductor layer 410. The N-type semiconductor layer 410 may be a substrate comprised of a semiconductor material such as a silicon material. In some embodiments, the N-type semiconductor layer 410 may be a well region disposed in a substrate.

A first P-type junction region 421 and a second P-type junction region 430 may be disposed in an upper region of the active region 401 defined in the N-type semiconductor layer 410 to be spaced apart from each other. The second P-type junction region 430 may have a first impurity concentration. The first impurity concentration may be controlled to be lower than a predetermined concentration such that the second P-type junction region 430 and a metal plug or a metal silicide layer contacting the second P-type junction region 430 exhibit a rectifying characteristic such as a P-N diode characteristic.

In some embodiments, the first and second P-type junction regions 421 and 430 may be simultaneously formed using the same ion implantation process and the same activation process. In such a case, the first and second P-type junction regions 421 and 430 may have substantially the same impurity concentration and substantially the same junction depth.

A first heavily doped P-type junction region 422 may be disposed in an upper region of the first P-type junction region 421. The first P-type junction region 421 and the first heavily doped P-type junction region 422 may constitute a first junction region 420 having a double diffused drain (DDD) structure. The first heavily doped P-type junction region 422 may have a second impurity concentration which is higher than the first impurity concentration. The second impurity concentration may be controlled to be sufficiently higher than a certain concentration such that the first heavily doped P-type junction region 422 and a metal plug or a metal silicide layer contacting the first heavily doped P-type junction region 422 exhibit an ohmic contact characteristic.

A gate insulation pattern 440 may be disposed on the N-type semiconductor layer 410 between the first and second P-type junction regions 421 and 430. A floating gate pattern 450 may be disposed on a top surface of the gate insulation pattern 440 opposite to the N-type semiconductor layer 410.

In some embodiments, the gate insulation pattern 440 may include an oxide layer, and the floating gate pattern 450 may include a polysilicon layer. The floating gate pattern 450 may be fully surrounded by an insulation layer. Thus, the floating gate pattern 450 may be electrically isolated and floated. The gate insulation pattern 440 and the floating gate pattern 450 may fully overlap each other in a plan view such that sidewalls of the gate insulation pattern 440 are vertically self-aligned with sidewalls of the floating gate pattern 450 respectively. The floating gate pattern 450 may extend in a second direction intersecting the first direction to have a stripe shape.

A first gate spacer 461 and a second gate spacer 462 may be disposed on both sidewalls of the floating gate pattern 450, respectively. The first gate spacer 461 and the second gate spacer 462 may downwardly extend to cover both sidewalls of the gate insulation pattern 440, respectively. In some embodiments, each of the first and second gate spacers 461 and 462 may include a nitride layer, an oxide layer, or a combination thereof. The first and second P-type junction regions 421 and 430 may be aligned with both sidewalls of the gate insulation pattern 440, respectively. The first heavily doped P-type junction region 422 may be aligned with an outer sidewall of the first gate spacer 461.

A first metal silicide layer 471 may be disposed on a top surface of the first heavily doped P-type junction region 422. The first heavily doped P-type junction region 422 and the first metal silicide layer 471 may contact each other to provide an ohmic contact. A first metal contact plug 481 may be disposed on a top surface of the first metal silicide layer 471. The first metal contact plug 481 may be electrically coupled to a first selection line X.

A second metal silicide layer 472 may be disposed on the second P-type junction region 430. A second metal contact plug 482 may be disposed on the second metal silicide layer 472. The second metal contact plug 482 may be electrically coupled to a second selection line Y.

The second P-type junction region 430 and the second metal silicide layer 472 may contact each other to provide a schottky contact. That is, the second P-type junction region 430 and the second metal silicide layer 472 may constitute a schottky barrier diode 490. The second P-type junction region 430 and the second metal silicide layer 472 may correspond to an anode and a cathode of the schottky barrier diode 490, respectively.

Thus, a current may flow from the second P-type junction region 430 toward the second metal silicide layer 472 when the schottky barrier diode 490 is forward-biased. If the schottky barrier diode 490 is reverse-biased, no current flows through the schottky barrier diode 490. If the EPROM cell 400 is repeatedly arrayed in a matrix form to provide an EPROM cell array, malfunction of the EPROM cell array due to a sneak current may be suppressed due to the presence of the schottky barrier diodes 490 exhibiting a rectifying characteristic.

Figure 8:
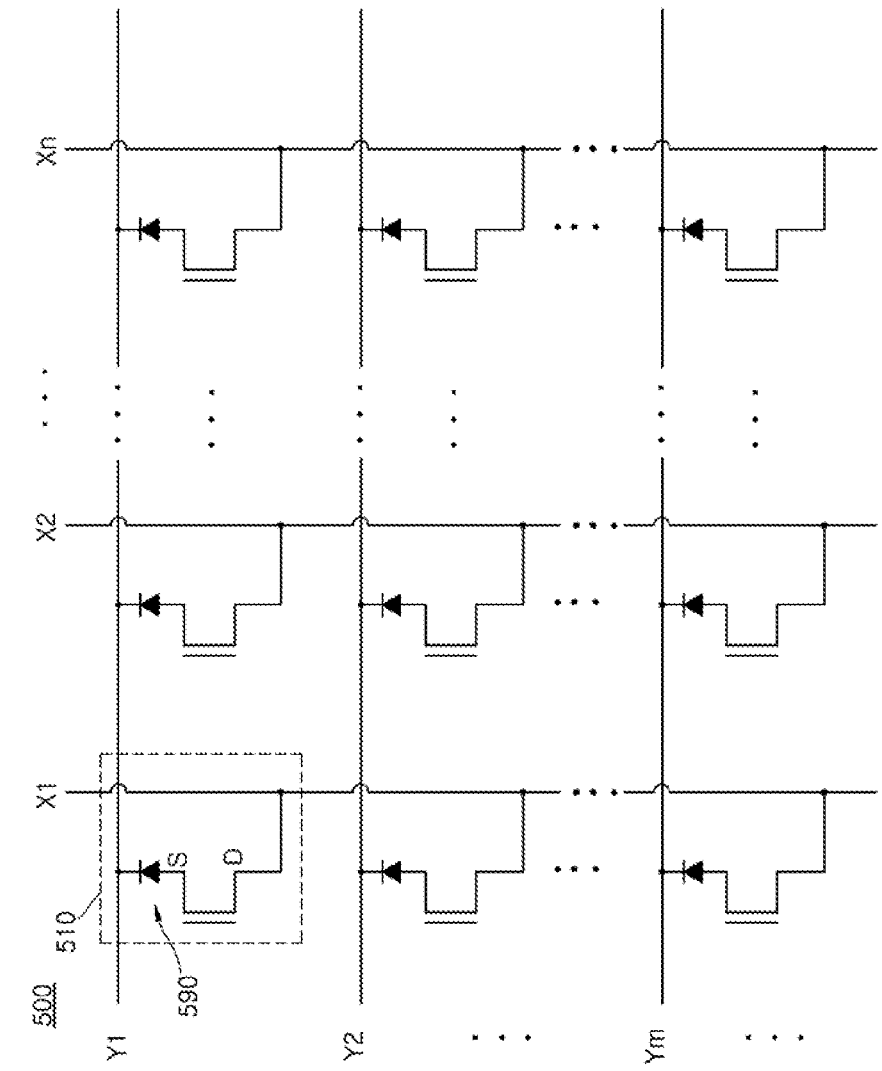
FIG. 8 is an equivalent circuit diagram illustrating an EPROM cell array according to an embodiment.

FIG. 8 is an equivalent circuit diagram illustrating an EPROM cell array 500 according to an embodiment. Referring to FIG. 8, the EPROM cell array 500 may be configured to include a plurality of unit cells 510 which are arrayed along a first direction and a second direction to have an 'm×n' matrix form. The first and second directions may intersect each other. Each of the plurality of unit cells 510 may include a MOSFET having a drain terminal D and a source terminal S.

The drain terminals D of the unit cells 510 arrayed in a single row parallel with the first direction may be connected to first selection lines X1, X2, . . . , and Xn, respectively. The source terminals S of the unit cells 510 arrayed in a single column parallel with the second direction may be connected to second selection lines Y1, Y2, . . . , and Ym, respectively.

Each of the unit cells 510 may further include a schottky barrier diode 590 that is coupled between the source terminal S of the MOSFET and one of the second selection lines Y1, Y2, . . . , and Ym. Each of the unit cells 510 may correspond to one of the EPROM cells 100, 300 and 400 which are described with reference to FIGS. 1 to 7.

Figure 9:
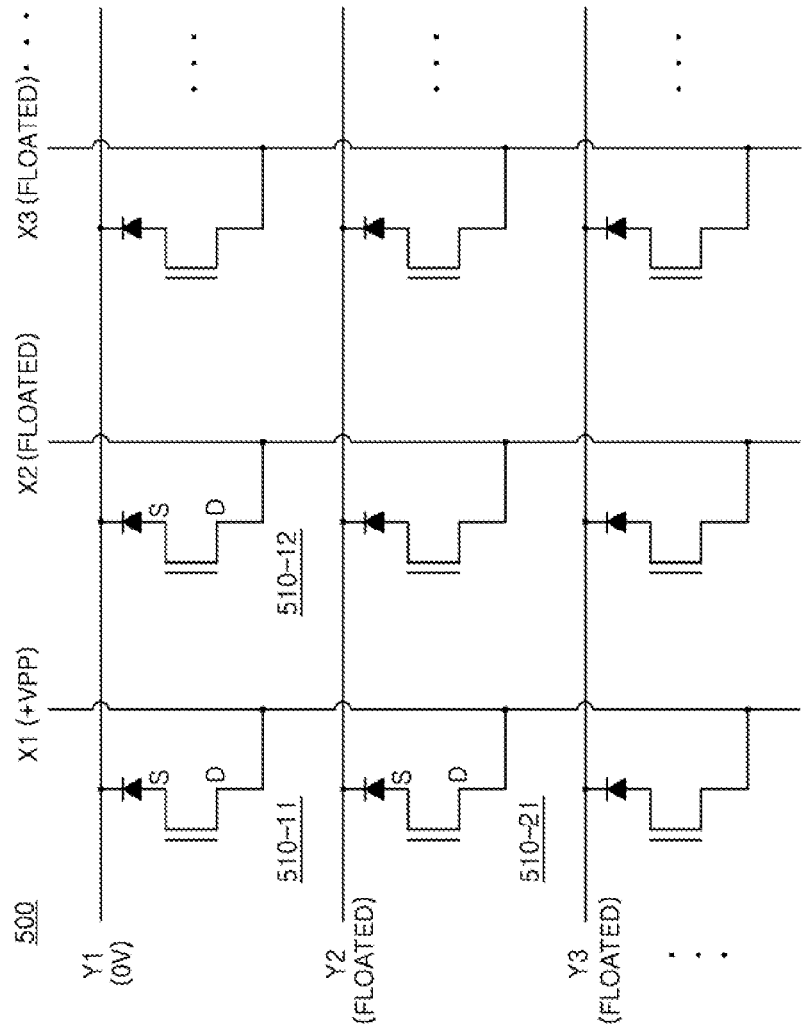
FIG. 9 is an equivalent circuit diagram illustrating a program operation of the EPROM cell array shown in FIG. 8.

FIG. 9 is an equivalent circuit diagram illustrating a program operation of the EPROM cell array 500 shown in FIG. 8. Referring to FIG. 9, the EPROM cell array 500 may include a plurality of unit cells 510-11, 510-12, . . . , 510-21, . . . that are respectively disposed at cross points of the first selection lines X1, X2, X3, . . . and the second selection lines Y1, Y2, Y3, . . . .

The unit cell 510-11 may be selectively programmed by applying a positive program voltage +VPP to the first selection line X1 connected to the selected unit cell 510-11, by electrically floating the remaining first selection line X2, X3, . . . , by grounding the second selection line Y1 connected to the selected unit cell 510-11, and by floating the remaining the second selection lines Y2, Y3, . . . . Under the above program bias condition, the positive program voltage +VPP may be applied to the drain terminal D of the selected unit cell 510-11 through the first selection line X1 and a ground voltage may be applied to the source terminal S of the selected unit cell 510-11 through the first selection line X1. Thus, hot electrons may be injected into the floating gate of the selected unit cell 510-11, as described with reference to FIG. 2. As a result, the selected unit cell 510-11 may have a programmed state.

While the selected unit cell 510-11 is programmed, the positive program voltage +VPP may be applied to the drain terminal D of the unit cell 510-21 sharing the first selection line X1 with the selected unit cell 510-11. However, the source terminal S of the unit cell 510-21 may be floated. Thus, since no avalanche breakdown phenomenon occurs in the unit cell 510-21, the unit cell 510-21 may not be programmed. Similarly, the remaining unit cells sharing the first selection line X1 with the selected unit cell 510-11 may not be programmed since the remaining second selection lines Y3, . . . are floated.

In addition, while the selected unit cell 510-11 is programmed, the source terminal S of the unit cell 510-12 sharing the second selection line Y1 with the selected unit cell 510-11 may be grounded but the drain terminal D of the unit cell 510-12 may be floated. Thus, since no avalanche breakdown phenomenon occurs in the unit cell 510-12, the unit cell 510-12 may not be programmed. Similarly, the remaining unit cells sharing the second selection line Y1 with the selected unit cell 510-11 may not be programmed since the remaining first selection lines X3, . . . are floated. All of the other unit cells connected to the floated first selection lines X2, X3, . . . and the floated second selection lines Y2, Y3, . . . may not be programmed since all of the source terminals S and the drain terminals D of the other unit cells are floated.

Figure 10:
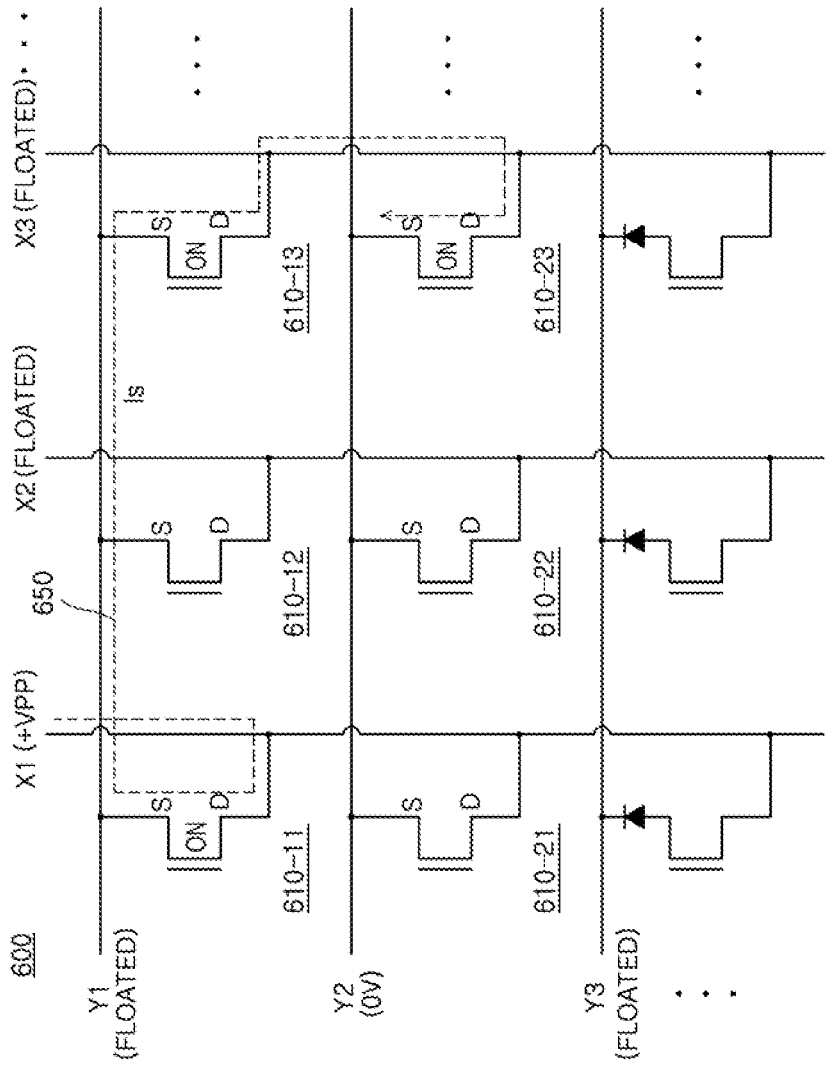
FIG. 10 is an equivalent circuit diagram illustrating a program error due to a sneak current of a general EPROM cell array.

FIG. 10 is an equivalent circuit diagram illustrating an erroneous program operation due to a sneak current of a general EPROM cell array 600 without schottky barrier diodes. Referring to FIG. 10, the general EPROM cell array 600 may be configured to include a plurality of unit cells 610-11, 610-12, 610-13, . . . , 610-21, 610-22, 610-23, . . . that are respectively disposed at cross points of the first selection lines X1, X2, X3, . . . and the second selection lines Y1, Y2, Y3, . . . . Each of the plurality of unit cells 610-11, 610-12, 610-13, . . . , 610-21, 610-22, 610-23, . . . , may be comprised of a P-channel MOSFET having a floating gate, a drain terminal D connected to one of the first selection lines X1, X2, X3, . . . , and a source terminal S connected to one of the second selection lines Y1, Y2, Y3, . . . .

The drain terminals D of the unit cells arrayed in the same column may be connected to any one of the first selection lines X1, X2, X3, . . . . For example, the drain terminals D of the unit cells 610-11, 610-21, . . . arrayed in the first column may be connected to the first selection line X1 in common.

The source terminals S of the unit cells arrayed in the same row may be connected to any one of the second selection lines Y1, Y2, Y3, For example, the source terminals S of the unit cells 610-11, 610-12, 610-13, . . . arrayed in the first row may be connected to the second selection line Y1 in common.

Hereinafter, an operation for selectively programming the unit cell 610-21 coupled to the first and second selection lines X1 and Y2 will be described in conjunction with an example in which the unit cells 610-11, 610-13 and 610-23 have a programmed state to be normally turned on. In order to selectively program the unit cell 610-21, a positive program voltage +VPP may be applied to the first selection line X1 and a ground voltage may be applied to the second selection line Y2. In addition, the remaining first selection lines X2, X3, . . . and the remaining second selection lines Y1, Y3, . . . may be floated. Under the above bias condition, the selected unit cell 610-21 has to be programmed by the program operation as described with reference to FIG. 2 and the remaining non-selected unit cells ought not to be programmed.

However, in such a case, an undesired current may flow along a sneak current path Is which is provided by the first selection line X1, the second selection line Y2 and the non-selected unit cells 610-11, 610-13 and 610-23 (see dotted line 650 of FIG. 10). Thus, the positive program voltage +VPP applied to the first selection line X1 may be lowered to a level insufficient to cause an avalanche breakdown phenomenon of the selected unit cell 610-21. As a result, the selected unit cell 610-21 may be insufficiently programmed or may not be programmed.

Figure 11:
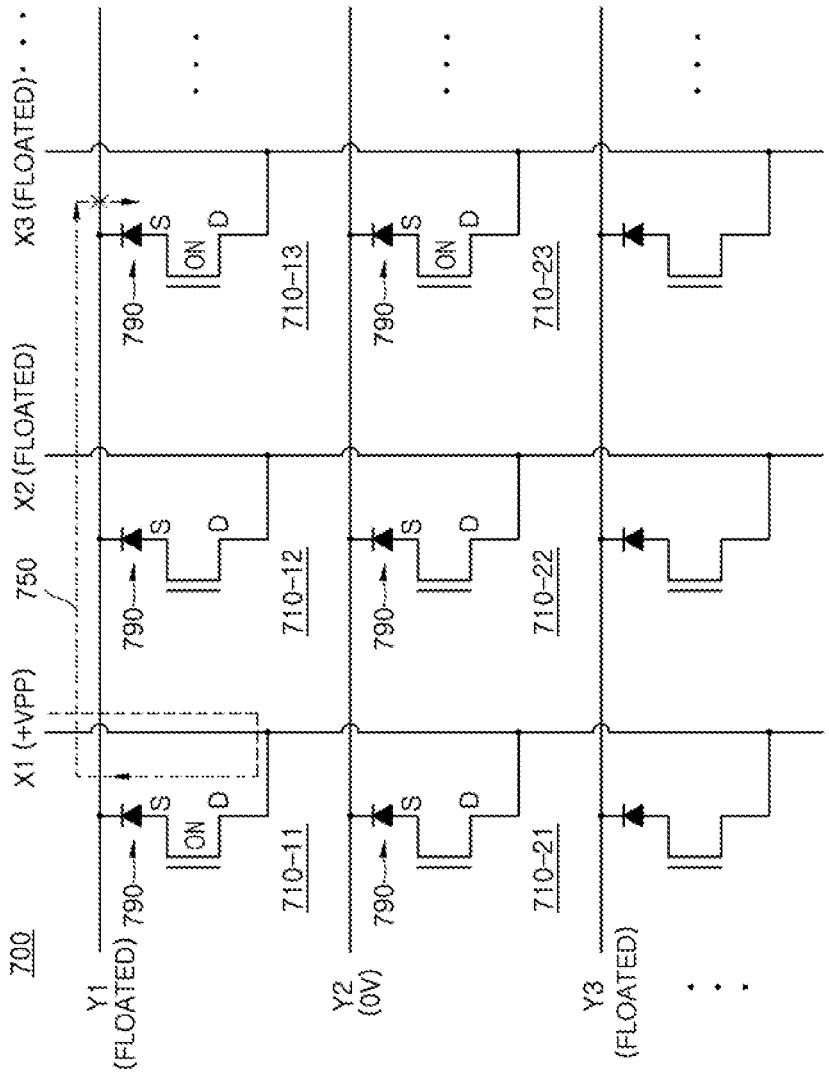
FIG. 11 is an equivalent circuit diagram illustrating a mechanism in which a program error occurring due to a sneak current is prevented in the EPROM cell array shown in FIG. 8.

FIG. 11 is an equivalent circuit diagram of an EPROM cell array 700 illustrating how an erroneous program operation due to a sneak current is prevented in the EPROM cell array 500. Referring to FIG. 11, the EPROM cell array 700 may have the same configuration as the EPROM cell array 500 described with reference to FIG. 8.

That is, the EPROM cell array 700 may be configured to include a plurality of unit cells 710-11, 710-12, 710-13, 710-21, 710-22, 710-23, . . . which are arrayed along a first direction and a second direction to have a matrix form. The first and second directions may intersect each other. Each of the plurality of unit cells 710-11, 710-12, 710-13, 710-21, 710-22, 710-23, . . . may include a MOSFET having a drain terminal D and a source terminal S. The drain terminals D of the unit cells arrayed in the same column may be connected to any one of the first selection lines X1, X2, X3, . . . . The source terminals S of the unit cells arrayed in the same row may be electrically connected to any one of the second selection lines Y1, Y2, Y3, . . . .

Each of the unit cells 710-11, 710-12, 710-13, 710-21, 710-22, 710-23, . . . may further include a schottky barrier diode 790. The schottky barrier diode 790 may be coupled between the source terminal S of each of the MOSFETs and any one of the second selection lines Y1, Y2, Y3, . . . . In such a case, an anode and a cathode of the schottky barrier diode 790 may be connected to the source terminal S and the second selection line, respectively.

Hereinafter, an operation for selectively programming the unit cell 710-21 coupled to the first and second selection lines X1 and Y2 will be described. For example, the unit cells 710-11, 710-13 and 710-23 may be turned on in the course of selectively programming the unit cell 710-21, In order to selectively program the unit cell 710-21, a positive program voltage +VPP may be applied to the first selection line X1 and a ground voltage may be applied to the second selection line Y2. In addition, the remaining first selection lines X2, X3, . . . and the remaining second selection lines Y1, Y3, . . . may be floated.

According to an embodiment, under the above bias condition, the selected unit cell 710-21 may be programmed by the program operation as described with reference to FIG. 2 and the remaining non-selected unit cells are not programmed. That is, an erroneous program operation due to a sneak current may be prevented.

Specifically, a sneak current path, which is provided by the first and second selection lines X1 and Y1 and the non-selected unit cell 710-11, may be electrically opened by a reverse bias applied to the schottky barrier diode 790 of the non-selected unit cell 710-13 (see a dotted line 750 of FIG. 11). As a result, the second selection line Y2 may still have a voltage level corresponding to the ground voltage, and the first selection line X1 may still have a voltage level corresponding to the positive program voltage +VPP.

Since each of the unit cells 710-11, 710-12, 710-13, 710-21, 710-22, 710-23, . . . includes the schottky barrier diode 790, sneak current paths provided from the first selection lines connected to the non-selected unit cells toward the source terminals S of the unit cells having an on state may be electrically opened even though the non-selected unit cells have an on state. Accordingly, a program error due to a sneak current may be prevented.

Figure 12:
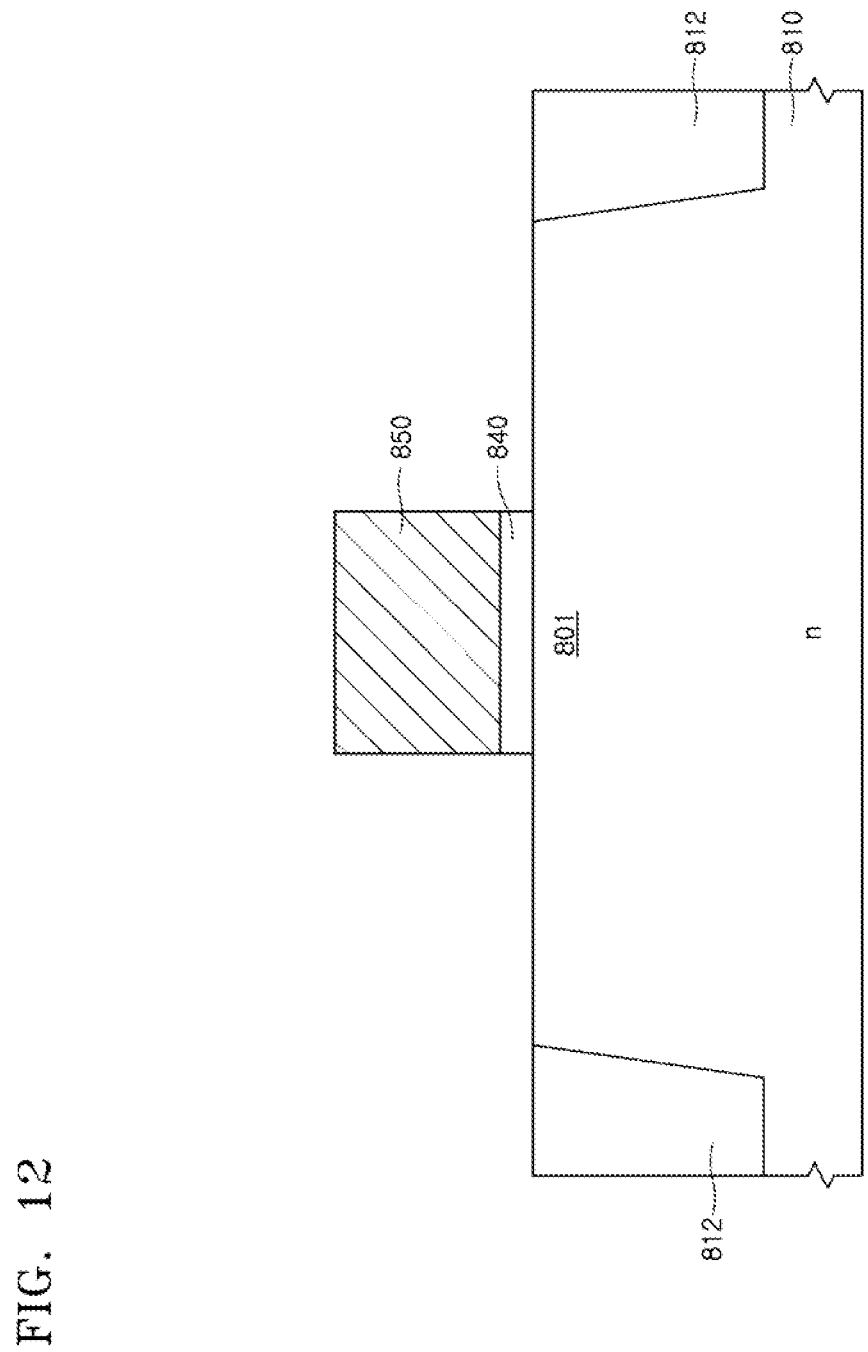
FIGS. 12 to 15 are cross-sectional views illustrating a method of fabricating an EPROM cell according to an embodiment.

FIGS. 12 to 15 are cross-sectional views illustrating a method of fabricating an EPROM cell according to an embodiment. Referring to FIG. 12, a trench isolation layer 812 may be formed in an upper region of an N-type semiconductor layer 810 to define an active region 801. A gate insulation pattern 840 and a floating gate pattern 850 crossing the active region 801 may be formed on the N-type semiconductor layer 810. The floating gate pattern 850 may be formed on the gate insulation pattern 840, and the floating gate pattern 850 and the gate insulation pattern 840 may be formed using the same patterning process. Thus, sidewalls of the floating gate pattern 850 may be vertically self-aligned with sidewalls of the gate insulation pattern 840, respectively. In some embodiments, the gate insulation pattern 840 may be formed of an oxide layer, and the floating gate pattern 850 may be formed of a polysilicon layer.

Figure 13:
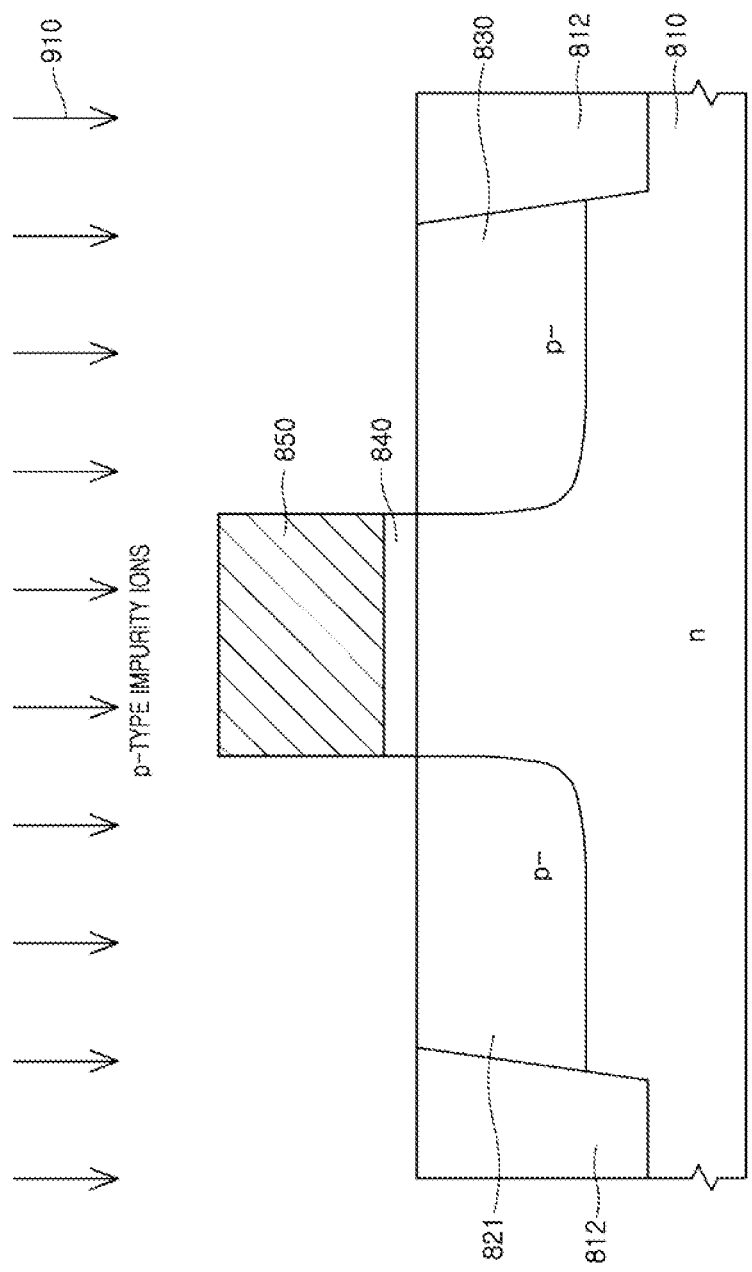

Referring to FIG. 13, p-type impurity ions may be implanted into the active region 801 using the floating gate pattern 850 as an implantation mask to form a first P-type junction region 821 and a second P-type junction region 830, as indicated by arrows 910. The first and second P-type junction regions 821 and 830 may be formed to have a first impurity concentration. The first impurity concentration may be controlled to be lower than a predetermined concentration such that the second P-type junction region 830 and a metal plug or a metal silicide layer contacting the second P-type junction region 830, exhibit a rectifying characteristic such as a P-N diode characteristic. The first and second P-type junction regions 821 and 830 may be formed to be self-aligned with both sidewalls of the floating gate pattern 850, respectively.

Figure 14:
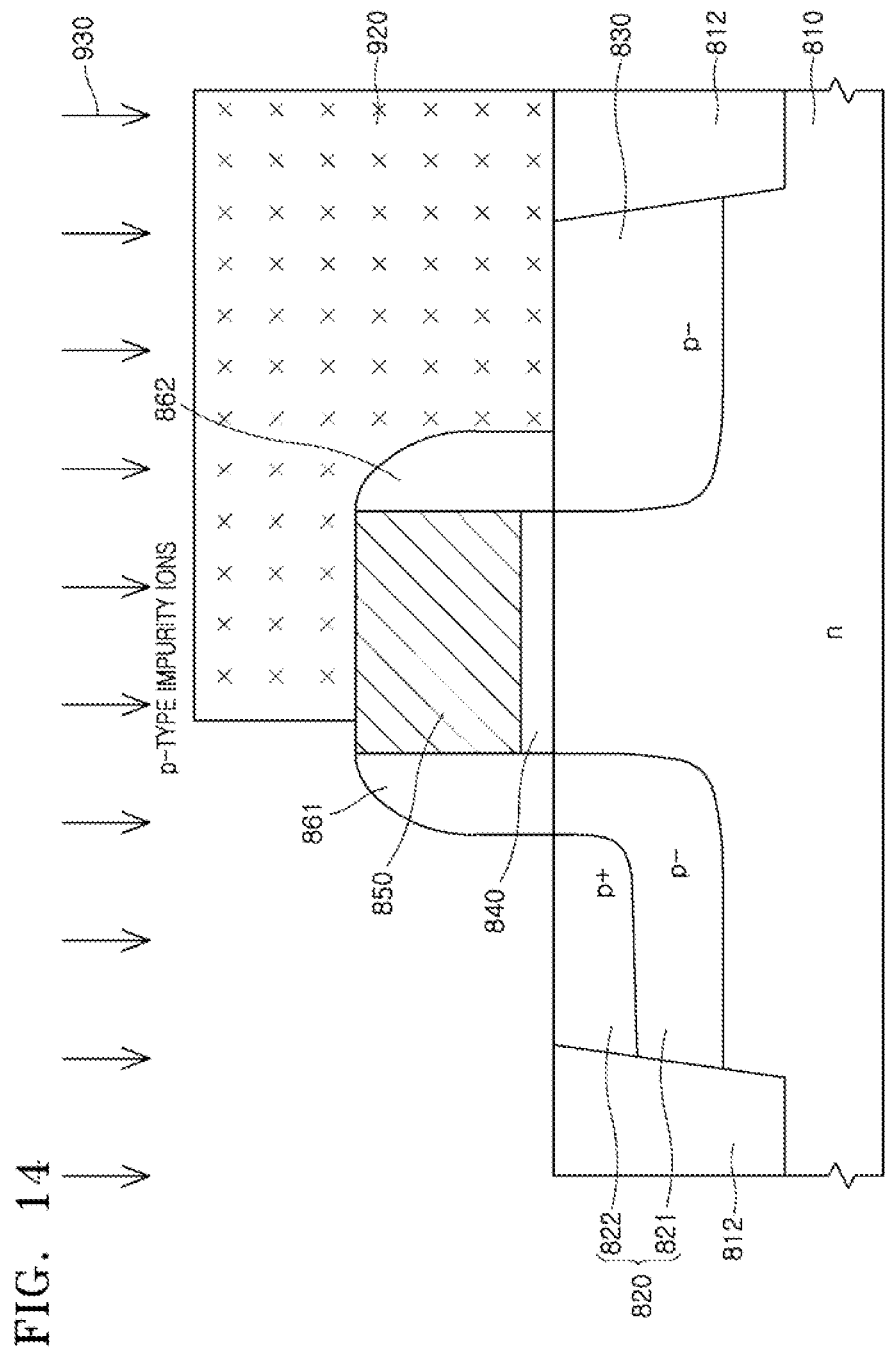

Referring to FIG. 14, a first gate spacer 861 and a second gate spacer 862 may be formed on both sidewalls of the floating gate pattern 850, respectively. The first gate spacer 861 and the second gate spacer 862 may also be formed to cover both sidewalls of the gate insulation pattern 840, respectively. In some embodiments, the first gate spacer 861 and the second gate spacer 862 may be formed to include an oxide layer or a nitride layer.

A mask pattern 920 may be formed on the second P-type junction region 830 to expose the first P-type junction region 821. In some embodiments, the mask pattern 920 may be formed of a photoresist layer. As indicated by arrows 930, p-type impurity ions may be implanted into the first P-type junction region 821 using the mask pattern 920 and the first gate spacer 861 as implantation masks to form a first heavily doped P-type junction region 822 in an upper region of the first P-type junction region 821.

The first P-type junction region 821 and the first heavily doped P-type junction region 822 may constitute a first junction region 820 having a double diffused drain (DDD) structure. The first heavily doped P-type junction region 822 may be formed to have a second impurity concentration which is higher than the first impurity concentration. The second impurity concentration may be controlled to have a sufficiently higher concentration such that the first heavily doped P-type junction region 822 and a metal plug or a metal silicide layer, which will be formed later contacts the first heavily doped P-type junction region 822, to exhibit an ohmic contact characteristic. The mask pattern 920 may be removed after the first heavily doped P-type junction region 822 is formed.

Figure 15:
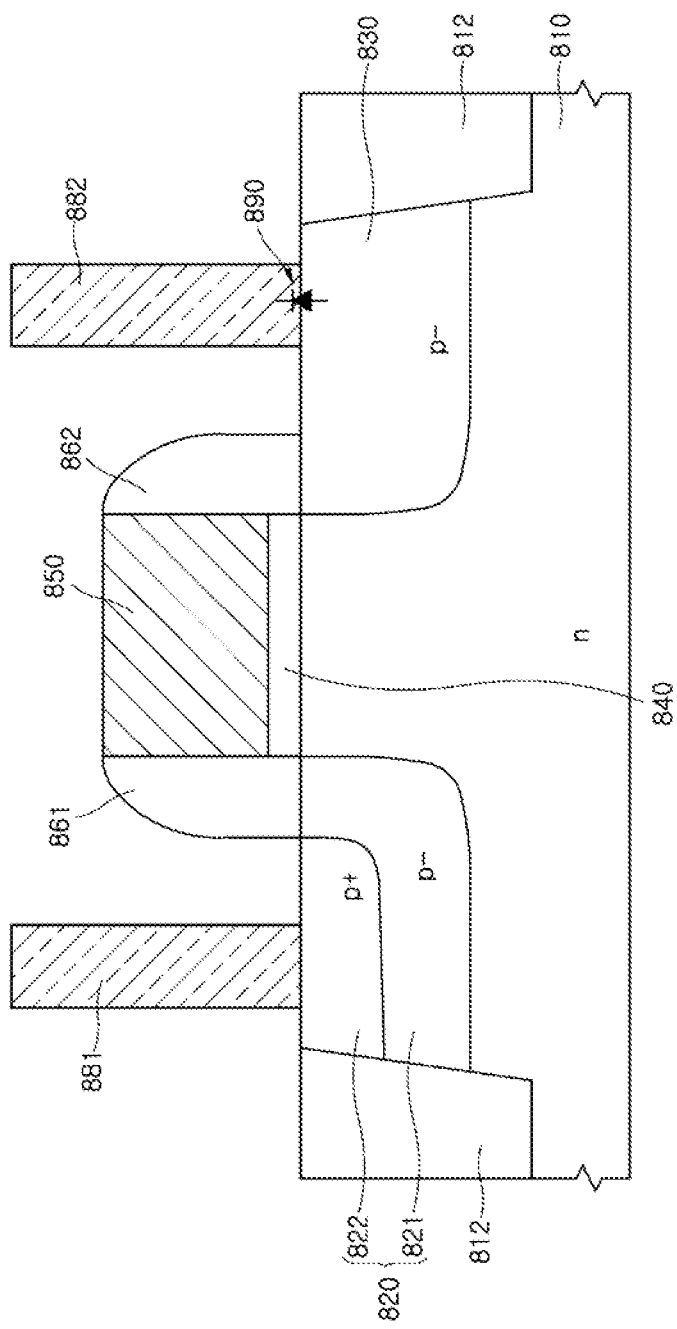

Referring to FIG. 15, a first metal contact plug 881 and a second metal contact plug 882 may be formed on the first heavily doped P-type junction region 822 and the second P-type junction region 830, respectively. While the first and second metal contact plugs 881 and 882 are formed, no conductive pattern is formed on the floating gate pattern 850. That is, the floating gate pattern 850 may be electrically isolated and floated.

The first metal contact plug 881 and the first heavily doped P-type junction region 822 may contact each other to provide an ohmic contact. The second metal contact plug 882 and the second P-type junction region 830 may contact each other to provide a schottky contact. Thus, the second metal contact plug 882 and the second P-type junction region 830 may constitute a schottky barrier diode 890. Although not shown in FIG. 15, a metal silicide layer may be formed on at least one of the first heavily doped P-type junction region 822 and the second P-type junction region 830 before the first and second metal contact plugs 881 and 882 are formed.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. An electrically programmable read only memory (EPROM) cell comprising:
    a semiconductor layer having a first conductivity;
    a first junction region having a second conductivity and a second junction region having the second conductivity, wherein the first and the second junction regions are disposed in an upper region of the semiconductor layer and spaced apart from each other;
    a gate insulation pattern and a floating gate pattern sequentially stacked over the semiconductor layer between the first and second junction regions;
    a first metal contact plug coupled to the first junction region, wherein an ohmic contact is formed between the first metal contact plug and the first junction region; and
    a second metal contact plug coupled to the second junction region, wherein a schottky contact is formed between the second metal contact plug and the second junction region.

2. The EPROM cell of claim 1, wherein the first conductivity is N-type conductivity and the second conductivity is P-type conductivity.

3. The EPROM cell of claim 1, wherein the first junction region includes:
    a first lightly doped junction region disposed in the semiconductor layer and having a first impurity concentration; and
    a first heavily doped junction region disposed in an upper region of the first lightly doped junction region and having a second impurity concentration,
    wherein the first lightly doped junction region and the first heavily doped junction region, in combination, constitute a double diffused drain (DDD) structure.

4. The EPROM cell of claim 3, wherein the first lightly doped junction region and the second junction region are aligned with both sidewalls of the floating gate pattern, respectively.

5. The EPROM cell of claim 3, wherein the second junction region has substantially the same junction depth as the first junction region.

6. The EPROM cell of claim 3, wherein the second junction region has the first impurity concentration.

7. The EPROM cell of claim 3, further comprising:
    a first gate spacer and a second gate spacer disposed over first and second sidewalls of the floating gate pattern and further extending over first and second sidewalls of the gate insulation pattern, respectively,
    wherein the first heavily doped junction region is aligned with an outer sidewall of the first gate spacer.

8. The EPROM cell of claim 1, further comprising:
    a metal silicide layer disposed between the second junction region and the second metal contact plug.

9. The EPROM cell of claim 1, further comprising:
    a first metal silicide layer disposed between the first junction region and the first metal contact plug; and
    a second metal silicide layer disposed between the second junction region and the second metal contact plug.

10. An electrically programmable read only memory (EPROM) cell array comprising:
    first selection lines,
    second selection lines intersecting the first selection lines, and
    unit cells respectively disposed at cross points of the first and second selection lines,
    wherein each of the unit cells comprises:
        a semiconductor layer having a first conductivity;
        a first junction region having a second conductivity and a second junction region having the second conductivity, wherein the first and the second junction regions are disposed in an upper region of the semiconductor layer and spaced apart from each other;
        a gate insulation pattern and a floating gate pattern sequentially stacked over the semiconductor layer between the first and second junction regions;
        a first metal contact plug coupled to the first junction region, wherein an ohmic contact is formed between the first metal contact plug and the first junction region; and
        a second metal contact plug coupled to the second junction region, wherein a schottky contact is formed between the second metal contact plug and the second junction region.

11. The EPROM cell array of claim 10,
    wherein the first metal contact plug serves as a drain terminal,
    wherein the second metal contact plug serves as a source terminal, and wherein the drain terminal and the source terminal are connected to one of the first selection lines and one of the second selection lines, respectively.

12. The EPROM cell array of claim 11,
wherein the drain terminals of the unit cells arrayed in the same column are commonly connected to one of the first selection lines, and
wherein the source terminals of the unit cells arrayed in the same row are commonly connected to one of the second selection lines.

13. The EPROM cell array of claim 10, wherein the first conductivity is N-type conductivity and the second conductivity is P-type conductivity.

14. The EPROM cell array of claim 11, wherein the first junction region includes:
a first lightly doped junction region disposed in the semiconductor layer and having a first impurity concentration; and
a first heavily doped junction region disposed in an upper region of the first lightly doped junction region and having a second impurity concentration,
wherein the first lightly doped junction region and the first heavily doped junction region, in combination, constitute a double diffused drain (DDD) structure.

15. The EPROM cell array of claim 14, wherein the first lightly doped junction region and the second junction region are aligned with first and second sidewalls of the floating gate pattern, respectively.

16. The EPROM cell array of claim 14, wherein the second junction region has substantially the same junction depth as the first junction region.

17. The EPROM cell array of claim 14, wherein the second junction region has the first impurity concentration.

18. The EPROM cell array of claim 14, further comprising:
a first gate spacer and a second gate spacer disposed over first and second sidewalls of the floating gate pattern and further extending over first and second sidewalls of the gate insulation pattern, respectively,
wherein the first heavily doped junction region is aligned with an outer sidewall of the first gate spacer.

19. The EPROM cell array of claim 10, further comprising:
a metal silicide layer disposed between the second junction region and the second metal contact plug.

20. The EPROM cell array of claim 10, further comprising:
a first metal silicide layer disposed between the first junction region and the first metal contact plug; and
a second metal silicide layer disposed between the second junction region and the second metal contact plug.

21. An electrically programmable read only memory (EPROM) cell array comprising:
a plurality of first selection lines;
a plurality of second selection lines intersecting the plurality of first selection lines; and
a plurality of unit cells respectively disposed at cross points of the plurality of first selection lines and the plurality of second selection lines,
wherein each of the plurality of unit cells includes a MOSFET and a schottky barrier diode, and
wherein the MOSFET and the schottky barrier diode are coupled in series to each other between any one of the plurality of first selection lines and any one of the plurality of second selection lines.

* * * * *